(12) United States Patent
Lewis et al.

(10) Patent No.: US 8,598,890 B2
(45) Date of Patent: Dec. 3, 2013

(54) METHOD AND SYSTEM FOR PROTECTING PRODUCTS AND TECHNOLOGY FROM INTEGRATED CIRCUITS WHICH HAVE BEEN SUBJECT TO TAMPERING, STRESSING AND REPLACEMENT AS WELL AS DETECTING INTEGRATED CIRCUITS THAT HAVE BEEN SUBJECT TO TAMPERING

(75) Inventors: James M. Lewis, Moulton, AL (US);
Paul H. Horn, Huntsville, AL (US);
Dane R. Walther, Madison, AL (US)

(73) Assignee: Lewis Innovative Technologies,
Moulton, AL (US)

( * ) Notice: Subject to any disclaimer, the term of this patent is extended or adjusted under 35 U.S.C. 154(b) by 338 days.

(21) Appl. No.: 13/094,331

(22) Filed: Apr. 26, 2011

(65) Prior Publication Data

US 2011/0234241 A1 Sep. 29, 2011

Related U.S. Application Data

(63) Continuation-in-part of application No. 12/487,693, filed on Jun. 19, 2009, now Pat. No. 8,242,790.

(60) Provisional application No. 61/329,315, filed on Apr. 29, 2010, provisional application No. 61/154,540, filed on Feb. 23, 2009.

(51) Int. Cl.
*G01R 27/28* (2006.01)

(52) U.S. Cl.
USPC .......................................................... 324/649

(58) Field of Classification Search
None
See application file for complete search history.

(56) References Cited

U.S. PATENT DOCUMENTS

| 5,471,194 | A | 11/1995 | Guscott |
|---|---|---|---|
| 6,373,264 | B1 | 4/2002 | Matsumoto et al. |
| 6,943,518 | B1 | 9/2005 | Mooney |
| 7,328,115 | B2 | 2/2008 | Shipton et al. |
| 2002/0036879 | A1 | 3/2002 | Vacherand et al. |
| 2002/0166058 | A1 | 11/2002 | Fueki |
| 2005/0151777 | A1 | 7/2005 | Silverbrook |
| 2006/0126412 | A1 | 6/2006 | Maki |
| 2006/0221686 | A1 | 10/2006 | Devadas et al. |
| 2007/0069875 | A1 | 3/2007 | Doi |
| 2007/0130452 | A1 | 6/2007 | Muir |
| 2007/0255966 | A1 | 11/2007 | Condorelli et al. |
| 2011/0227603 | A1* | 9/2011 | Leon et al. .................. 326/8 |

OTHER PUBLICATIONS

Bota, S.A. et al., "Smart Temperature Sensor for Thermal Testing of Cell-Based, ICs", Proceedings of the Design, Automation and Test in Europe Conference and Exhibition, 2005.

(Continued)

*Primary Examiner* — Jermele M Hollington
*Assistant Examiner* — Trung Nguyen
(74) *Attorney, Agent, or Firm* — Welsh Flaxman & Gitler LLC

(57) ABSTRACT

A system employs physical unclonable functions of an integrated circuit for detecting integrated circuits and protecting products and technology from integrated circuits which have been subject to tampering, stressing and replacement, and counterfeit components. The system includes a sensor detecting a characteristic impedance generated as a result of controlled access to a memory device of the integrated circuit. The characteristic impedance is applied in the creation of a discrimination matrix of values based on electrical interface signals for the integrated circuit. The sensor includes a ring oscillator and associated monitoring components. The ring oscillator is composed of the memory device of the integrated circuit and a sensory circuitry, wherein changes in a frequency generated by the ring oscillator is indicative of changes in circuitry.

16 Claims, 10 Drawing Sheets

(56) References Cited

OTHER PUBLICATIONS

Kaxiras, Stefanos, "4T-Decay Sensors: A New Class of Small, Fast, Robust, and Low-Power, Temperature/Leakage Sensors", ISLPED'04, Aug. 8-11, 2004, Newport Bch., CA, pp. 108-113.

Lopez-Buedo, Sergio et al., Thermal Testing on Reconfigurable Computers, IEEE Design & Test of Computers, Jan.-Mar. 2000, pp. 94-91.

* cited by examiner

|   | Address | | | | Data | | | | |
|---|---|---|---|---|---|---|---|---|---|
|   | A3 | A2 | A1 | A0 | D3 | D2 | D1 | D0 | |
| 0 | 0 | 0 | 0 | 0 | 0 | 0 | 0 | 0 | |
| 1 | 0 | 0 | 0 | 1 | 0 | 0 | 0 | 1 | |
| 2 | 0 | 0 | 1 | 0 | 0 | 0 | 1 | 0 | |
| 3 | 0 | 0 | 1 | 1 | 0 | 0 | 1 | 1 | |
| 4 | 0 | 1 | 0 | 0 | 0 | 1 | 0 | 0 | |
| 5 | 0 | 1 | 0 | 1 | 0 | 1 | 0 | 1 | |
| 6 | 0 | 1 | 1 | 0 | 0 | 1 | 1 | 0 | |
| 7 | 0 | 1 | 1 | 1 | 0 | 1 | 1 | 1 | |
| 8 | 1 | 0 | 0 | 0 | 1 | 0 | 0 | 0 | |
| 9 | 1 | 0 | 0 | 1 | 1 | 0 | 0 | 1 | |
| A | 1 | 0 | 1 | 0 | 1 | 0 | 1 | 0 | |
| B | 1 | 0 | 1 | 1 | 1 | 0 | 1 | 1 | |
| C | 1 | 1 | 0 | 0 | 1 | 1 | 0 | 0 | |
| D | 1 | 1 | 0 | 1 | 1 | 1 | 0 | 1 | |
| E | 1 | 1 | 1 | 0 | 1 | 1 | 1 | 0 | |
| F | 1 | 1 | 1 | 1 | 1 | 1 | 1 | 1 | |

Partial Memory Map, buffer function

FIG. 3

|   | Address | | | | Data | | | |
|---|---|---|---|---|---|---|---|---|
|   | A3 | A2 | A1 | A0 | D3 | D2 | D1 | D0 |
| 0 | 0 | 0 | 0 | 0 | 1 | 1 | 1 | 1 |
| 1 | 0 | 0 | 0 | 1 | 1 | 1 | 1 | 0 |
| 2 | 0 | 0 | 1 | 0 | 1 | 1 | 0 | 1 |
| 3 | 0 | 0 | 1 | 1 | 1 | 1 | 0 | 0 |
| 4 | 0 | 1 | 0 | 0 | 1 | 0 | 1 | 1 |
| 5 | 0 | 1 | 0 | 1 | 1 | 0 | 1 | 0 |
| 6 | 0 | 1 | 1 | 0 | 1 | 0 | 0 | 1 |
| 7 | 0 | 1 | 1 | 1 | 1 | 0 | 0 | 0 |
| 8 | 1 | 0 | 0 | 0 | 0 | 1 | 1 | 1 |
| 9 | 1 | 0 | 0 | 1 | 0 | 1 | 1 | 0 |
| A | 1 | 0 | 1 | 0 | 0 | 1 | 0 | 1 |
| B | 1 | 0 | 1 | 1 | 0 | 1 | 0 | 0 |
| C | 1 | 1 | 0 | 0 | 0 | 0 | 1 | 1 |
| D | 1 | 1 | 0 | 1 | 0 | 0 | 1 | 0 |
| E | 1 | 1 | 1 | 0 | 0 | 0 | 0 | 1 |
| F | 1 | 1 | 1 | 1 | 0 | 0 | 0 | 0 |

Partial Memory Map, Inverter Function

FIG. 4

Reference counter and impedance Counter Components

Reference Counter and Impedance Counter Timing Diagram

Sensor Evaluation System

Determination of Threshold Limits Dynamically

US 8,598,890 B2

METHOD AND SYSTEM FOR PROTECTING PRODUCTS AND TECHNOLOGY FROM INTEGRATED CIRCUITS WHICH HAVE BEEN SUBJECT TO TAMPERING, STRESSING AND REPLACEMENT AS WELL AS DETECTING INTEGRATED CIRCUITS THAT HAVE BEEN SUBJECT TO TAMPERING

CROSS REFERENCE TO RELATED PATENT APPLICATIONS

The present application claims the benefit of U.S. Provisional Patent Application Ser. No. 61/329,315, entitled "METHOD AND SYSTEM FOR PROTECTING PRODUCTS AND TECHNOLOGY FROM INTEGRATED CIRCUITS WHICH HAVE BEEN SUBJECT TO TAMPERING, STRESSING AND REPLACEMENT AS WELL AS DETECTING INTEGRATED CIRCUITS THAT HAVE BEEN SUBJECT TO TAMPERING", filed Apr. 29, 2010, and this application is a continuation in part of U.S. patent application Ser. No. 12/487,693, entitled "METHOD AND SYSTEM FOR DETECTION OF TAMPERING RELATED TO REVERSE ENGINEERING", filed Jun. 19, 2009, now U.S. Pat. No. 8,242,790, which claims the benefit of U.S. Provisional Patent Application Ser. No. 61/154,540, entitled "METHOD AND SYSTEM FOR DETECTION OF TAMPERING RELATED TO REVERSE ENGINEERING", filed Feb. 23, 2009.

BACKGROUND OF THE INVENTION

1. Field of the Invention

The invention relates a method and system for identifying tampering or reverse engineering of electronics.

2. Description of the Related Art

In the area of Anti-Tamper, there is interest in functions that can be used to identify a specific Integrated Circuit (IC). These functions are referred to as Physical Unclonable Functions (PUF) because every implementation of these functions will behave slightly differently due to manufacturing tolerances in the silicon or IC manufacturing process. (See Aegis: A Single-chip Secure Processor, G. Edward Suh, Charles W. O'Donnell, Srinivas Devadas, 0740-7475/07/$25.00 ©2007 IEEE CS and IEEE CASS, http://w\\'W.computer.org/csdl).

SUMMARY OF THE INVENTION

It is, therefore, an object of the present invention to provide a system employing physical unclonable functions of an integrated circuit for detecting integrated circuits and protecting products and technology from integrated circuits which have been subject to tampering, stressing and replacement, and counterfeit components. The system includes a sensor detecting a characteristic impedance generated as a result of controlled access to a memory device of the integrated circuit. The characteristic impedance is applied in the creation of a discrimination matrix of values based on electrical interface signals for the integrated circuit. The sensor includes a ring oscillator and associated monitoring components. The ring oscillator is composed of the memory device of the integrated circuit and a sensory circuitry, wherein changes in a frequency generated by the ring oscillator is indicative of changes in circuitry.

It is also an object of the present invention to provide a system wherein the frequency of the ring oscillator is a direct function of Address/Data pairs of the memory device of the integrated circuit.

It is another object of the present invention to provide a system wherein the ring oscillator includes a logical inverter function and a delay function.

It is a further object of the present invention to provide a system wherein data values of the memory device are the inverse of the address values of the memory device, and the memory device is the inverter function.

It is also an object of the present invention to provide a system wherein the memory device is the delay function and the data values are equal to the address values.

It is another object of the present invention to provide a system wherein the frequency of the ring oscillator is a direct function of Address/Data pairs of the memory device of the integrated circuit and Address bits of the memory device are held constant and frequency of oscillation resulting from the ring oscillator is a function of the propagation delay and impedance of the Address bits and Data bits accessed under control of a control function.

It is a further object of the present invention to provide a system wherein the frequency of the ring oscillator is a direct function of Address/Data pairs of the memory device of the integrated circuit and the discrimination matrix is developed identifying individual Address/Data pairs for consideration in distinguishing and identifying the integrated circuit.

It is also an object of the present invention to provide a system further including a state machine that counts through all possible Address/Data pairs.

It is another object of the present invention to provide a system wherein the discrimination matrix represents the characteristic impedance of the ring oscillator based upon different Address/Data pairs.

It is a further object of the present invention to provide a system wherein the sensory circuitry is implemented in a PLD.

Other objects and advantages of the present invention will become apparent from the following detailed description when viewed in conjunction with the accompanying drawings, which set forth certain embodiments of the invention.

BRIEF DESCRIPTION OF THE DRAWINGS

FIG. 3 is a partial memory map for use in conjunction with the system disclosed in FIG. 1.

FIG. 4 is a partial memory map for use as an inverter in conjunction with the system disclosed in FIG. 5.

DESCRIPTION OF THE PREFERRED EMBODIMENTS

Figure 1:
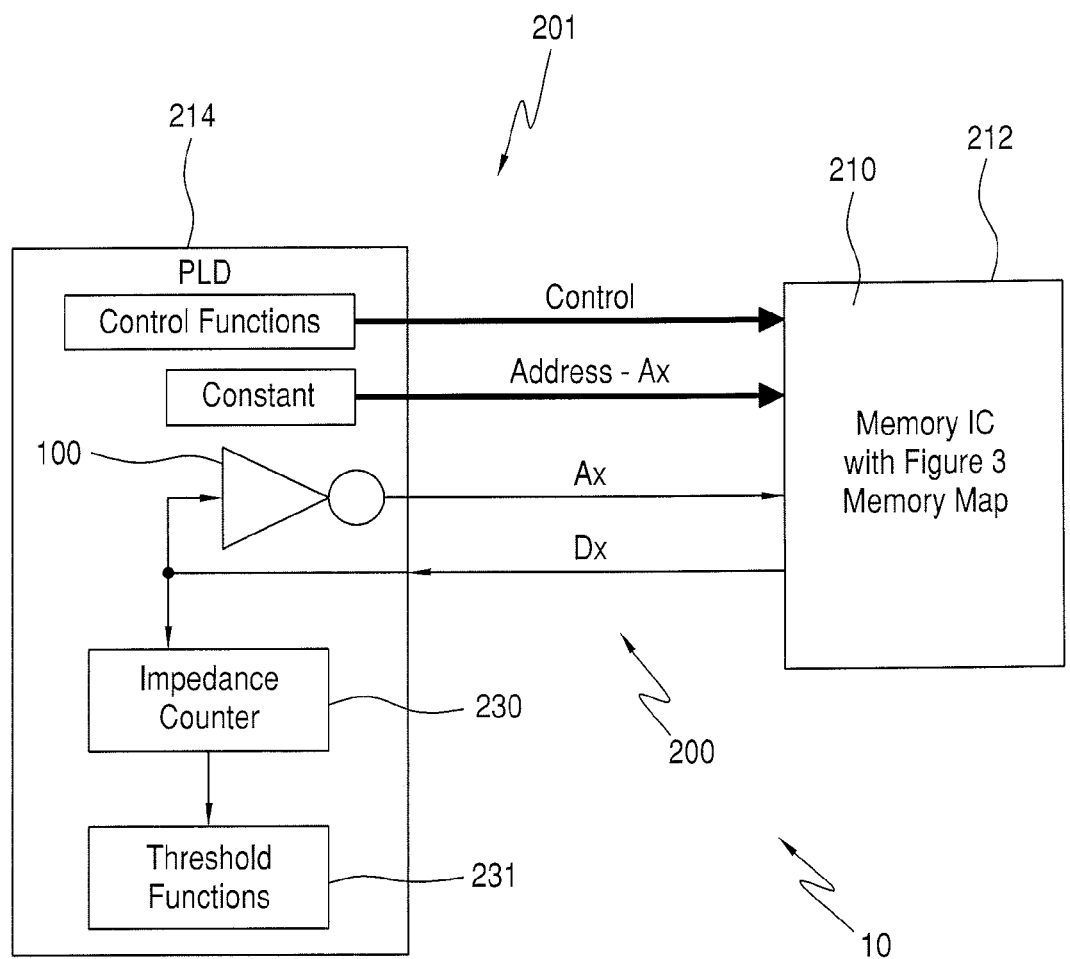
FIG. 1 is a schematic of a sensor in accordance with the present invention.

The detailed embodiments of the present invention are disclosed herein. It should be understood, however, that the disclosed embodiments are merely exemplary of the invention, which may be embodied in various forms. Therefore, the details disclosed herein are not to be interpreted as limiting, but merely as a basis for teaching one skilled in the art how to make and/or use the invention.

In accordance with the present invention, and with reference to the various figures, a method and system for protecting products and technology from integrated circuits which have been subject to tampering, stressing and/or replacement is disclosed. The present invention also provides a method and system for detecting integrated circuits that have been subject to tampering. The present method and system employs a sensor 201 that detects a frequency of a characteristic impedance generated as a result of controlled access to a memory 210 of an integrated circuit 212.

In fact, it is contemplated the present method and system may be implemented in a manner allowing for detection of undesirable access of an integrated circuit attempted through tampering without actual contact, that is, by tampering within the mere proximity of the integrated circuit at issue. Such detection is achieved by monitoring the near field effect of the probing instrument upon the integrated circuit at issue.

The present sensor 201 may be implemented in various sensory circuitry types, such as, discrete logic, in Programmable Logic Devices (PLD), in Application Specific Integrated Circuits (ASIC), or in microprocessor-based circuits. However, and for the purposes of the present disclosure, it is implemented using a PLD 214 and a memory device 210 of an integrated circuit 212. The embodiments described herein specifically anticipate implementations of the present sensor regardless of the format in which it is implemented.

The present invention allows for discrimination between seemingly identical devices. As a result of the present invention, a discrimination matrix of frequency values based on electrical interface signals is developed for specific integrated circuits. The developed discrimination matrix then serves as a virtual fingerprint of the specific memory device. The following description relates to use of the present system 10 in the discrimination of integrated circuit memories, although it usefulness may certainly be extended to other electrical devices within the context of the present invention. The present invention is an extension of U.S. patent application Ser. No. 12/487,693, entitled "METHOD AND SYSTEM FOR DETECTION OF TAMPERING RELATED TO REVERSE ENGINEERING", filed Jun. 19, 2009. The wealth of data in the discrimination matrix provides for the opportunity to greatly reduce or eliminate false positives and to derive peripheral information on the monitored device.

The present system 10 when implemented using ASICs, PLDs, and some microprocessor implementations in conjunction with the memory device 210 of the integrated circuit 212, does not require the addition of individual components for implementation of the sensor 201 into conjunction with an integrated circuit memory 210 being analyzed and monitored in accordance with the present invention. As such, the present sensor 201 is preferably implemented in a manner which creates no evidence of the incorporation of sensor circuitry to an integrated circuit being protected. Since the present sensor 201 does not exist as a separate entity, identification and defeat of the circuit is difficult. In the disclosed embodiments of the present sensor 201, an electronic device with implementation of the present sensor contains the identical components as a device lacking the present sensor.

While the underlying concepts embodied by the present invention may be implemented and demonstrated using discrete logic, such an implementation does not provide the stealth and phantom nature that other implementations provide. Further, full implementation in discrete logic would require numerous components. As such, it is preferred that the present invention be implemented in PLD and the remainder of this disclosure is directed to describing such an implementation in accordance with the spirit of the present invention. It should be understood the implementation of the present sensors in ASICs is identical to the PLD implementation. The implementation of the present sensors in microprocessor based circuitry is closely similar, if not entirely identical, to the implementation in programmable logic.

The technique discussed in this disclosure is Physical Unclonable Functions (PUF) that encompasses multiple integrated circuits and allows one integrated circuit to determine if another integrated circuit has been tampered with, stressed, and/or replaced. This is important, for instance, if the integrated circuit in question is a non-volatile memory device that contains the programming information for the computer, processor, or equipment upon which the integrated circuit is installed. The tampering could indicate that the authentic software (program) has been replaced with invalid programming or that the integrated circuit has been accessed in an attempt to determine the programming of a secure system. For example, it is known that stressing (for example, operating an integrated circuit at extremely low temperatures is known to stress the integrated circuit and ultimately alter the operating characteristics thereof) of integrated circuits potentially opens the integrated circuit for access to previously secure information.

The basic sensor 201 employed in accordance with the present invention is illustrated in FIG. 1. The present system 10 includes an exciter 200 and associated monitoring components (for example, impedance counter 230 and threshold function 231) as will be discussed below in greater detail. The basic concept of a ring oscillator is used in the implementation of the exciter 200 in accordance with the present invention. In its most basic form, a ring oscillator includes a logical inverter and a delay function. In accordance with the present embodiment, the integrated circuit memory 210 may serve either the invert function or the delay function, and the other inverter(s) of the ring oscillator serve the other functions thereof. The frequency of the ring oscillator is a function of the silicon technology used to construct the inverters and the impedance of the connecting circuit. As a result, and as will be appreciated based upon the following disclosure, the frequency of the ring oscillator will be a direct function of the Address/Data pairs of the memory device 210 of the integrated circuit 212.

Figure 2:
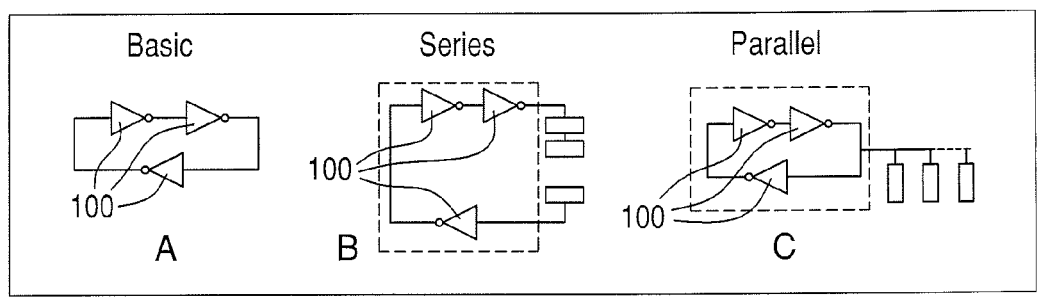
FIG. 2 is a schematic showing various ring oscillators that may be used in accordance with the present sensor.

As those skilled in the art will certainly appreciate, ring oscillators, sometimes referred to as "inverter feedback oscillators" are a well known technique for implementing a low cost oscillator in logic devices. Referring to FIG. 2, a basic ring oscillator (A) and the logical inverters 100 that make up the oscillator are shown. Variations on the basic oscillator are illustrated with additional components connected to the ring oscillator network in series (B) and in parallel (C).

The frequency of the ring oscillator is a function of the propagation delay of the digital inverters 100 and of the impedance of the connecting signals between each inverter 100. If changes are made to the integrated circuit 212 associated with the ring oscillator as described below in greater detail, the rate of oscillation (that is, the frequency generated as a result of the application of signals to the ring oscillator) will change.

The exciter 200 takes advantage of the functionality of traditional ring oscillators. Since the exciter 200 function in accordance with present invention may be implemented using PLD, ASIC, or microprocessor circuitry in conjunction with the memory device 210 of the integrated circuit 212, it is important to note that the specific implementation of the exciter 200 is not as important as the oscillation affect that results from the connection of the exciter 200 to the integrated circuit memory 210.

In accordance with the present invention, a memory device 210, for example, an integrated circuit memory, and a PLD 214 including an inverter 100 operate together to form the exciter 200, that is, a complete exciter 200 for implementation in accordance with the present invention. The memory device 210 may be a SRAM (Static Random Address Memory), a DRAM (Dynamic Random Address Memory), a ROM (Read Only Memory), a Flash Memory or any other type of volatile or non-volatile memory device with address and data lines. Memory devices used in digital electronics have data outputs that are a function of the address inputs. In this technique, the writing of the data is not important, only the reading processes. For this reason, and in accordance with a preferred embodiment, it is assumed that data has been written into the memory device 210 and that the writing process is well understood and efficient for the requirements of the system. Various memory devices have a number of methods and algorithms for writing (or storing) data into the memory device. The specific technique used to write the data is not a concern of the present system.

Many memory devices include an asynchronous read function, that is, a process for reading the data stored in memory without the use of a clock or synchronizing function. In the asynchronous read function, control signals (such as chip select, Read/Write signals, and Output Enable signals) are set to the appropriate state and a memory address is input to the memory device via the address bus signals. The memory data is then output based on the address and a "Data Valid" delay of the memory integrated circuit. If the control signals remain valid and the address changes, the data will change after the appropriate "Data Valid" delay.

Based on the relationship between the Address and the Data, the memory device 210 of the integrated circuit 212 can be used as either the inverter or the delay function of the ring oscillator (that is, the exciter 200). By using the memory device 210 as an integral part of the ring oscillator as discussed below in greater detail, the integrated circuit memory 210 contributes to the characteristic frequency of the ring oscillator and PUFs can be developed that are unique to the specific integrated circuit memory, Logic IC, and printed circuit board circuitry. In particular, one may study the time delays in the retrieval of data bits based upon address bits and determine whether changes have occurred in either operation of the integrated circuit 212 (for example, has the integrated circuit 212 been stressed) or actual integrated circuit 212 itself (for example, has the integrated circuit 212 been replaced by for another integrated circuit).

In practice, the address and data, that is, the Address/Data pair, work in the following manner. Consider the partial memory map illustrated in FIG. 3. If all other Address bits are held constant, D0=A0. Similarly, when all other address bits are held constant, D1=A1, D2=A2, and D3=A3. This memory map works as a delay function so that the circuit illustrated in FIG. 1 works as a complete sensor 201 monitoring time differences in the retrieval of data based upon a controlled access of known address bits and data bits. As a result, the frequency of the oscillation resulting from the exciter 200, that is, the ring oscillator of which the integrated circuit memory 210 and PLD 214 form an integral part, is a function of the address bits and data bits accessed under the control of the control functions.

In FIG. 1 an impedance sensing system is constructed of an inverter 100 formed in the PLD 214 and an integrated circuit memory 210. The ring oscillator, that is, the exciter 200 employed in accordance with the present invention, which includes an inverter(s) 100 and the integrated circuit memory 210 linked in series as shown in FIG. 1 relates to the series configuration shown in FIG. 2. The ring oscillator is composed of the Ax address signal, the integrated circuit memory 210, the Dx data signal, and the inverter 100 in the PLD 214. The remaining memory address signals and the control signals are not a part of the ring oscillator but are held constant so that the asynchronous read process can continue. The data lines other than Dx are ignored. It should be noted that any data bit can be utilized if it has the proper relationship to the respective address bit when all other address bits are held at some constant. As an example, A16 could be coupled with D0 when all other address bits (Address–Ax)=0xABCD, wherein 0xABCD indicates the hexadecimal value "ABCD" where 0x is used to indicate a hexadecimal number (base 16). In this way, all address bits can be tested to develop a complete set of characteristic frequency values (that is, a discrimination matrix) for the system 10.

Figure 5:
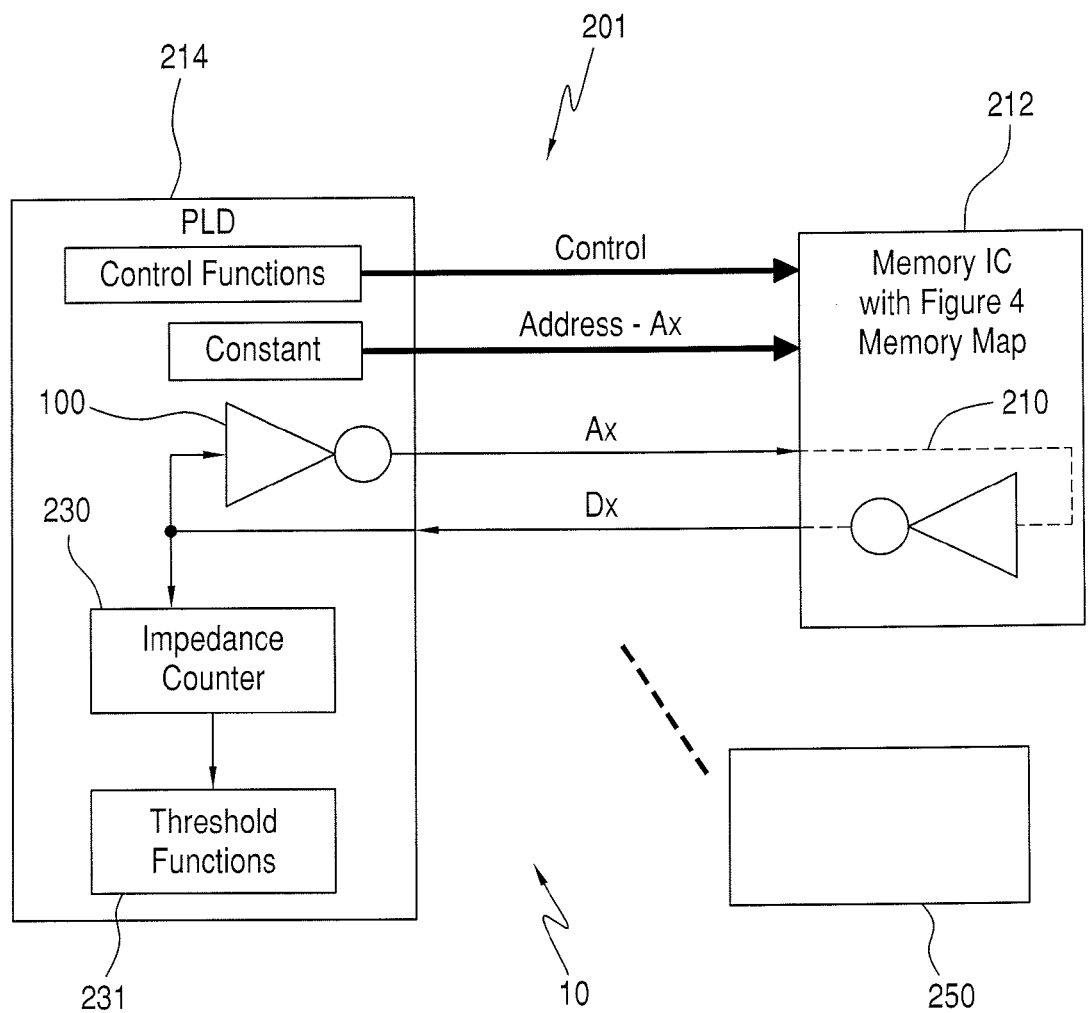
FIG. 5 is a schematic of a sensor in accordance with the present invention.

In accordance with an alternate embodiment as shown with reference to FIGS. 4 and 5, the integrated circuit memory 210 may also be used as the inverter in the ring oscillator. In the memory map shown in FIG. 4 the data value is the inverse of the address. This is an example of one inverter function. If any three address bits are held constant and the other address bit is used as a function input, the output of the data bit corresponding to function address bit is the inverse of the function input. As an example, if A2, A1, and A0 are all held constant (any logical combination from binary "000" to binary "111") then any logical "0" input on A3 results in a logical "1" output on signal D3. Similarly, any logical "1" input on A3 (with the other address lines maintained as a constant) results in a logical "0" output on signal D3. In this manner, the memory device 210 behaves as an inverter with the input on the A3 signal and the output on the D3 signal.

FIG. 5 shows the sensor system 10 with the PLD 214 providing the appropriate control signals and holding the unrelated address signals constant. The Ax signal drives the selected address line and the Dx signal outputs the inverse of Ax (signified by the inverter signal connected with dotted lines). The ring oscillator in this case is constructed by the buffer 100 in the PLD 214, the Ax signal, the memory device 210 serving as the virtual inverter and the Dx signal from the memory device 210 back to the PLD 214. As with the circuit illustrated in FIG. 1, the logic of the PLD 214 also includes a counter 230 to measure the ring oscillator frequency compared to some known standard and threshold functions to indicate whether acceptable operating limits of the integrated circuit 212 have been exceeded.

With the exciter 200 composed of a basic memory device 210 and PLD 214 based ring oscillator fully developed, a discrimination matrix is developed identifying frequencies associated with individual Address/Data pairs for consideration in distinguishing and identifying the integrated circuit 212 associated with the memory device 210. The development of a discrimination matrix may be extrapolated to a memory device of any size or number of address and data lines. For example, a pair of address and data bits is first defined as a set that includes exactly one address bit and one data bit and the case that all other address bits are held in some specific constant value. That is, for a memory device 210 with 24 address bits defined as Address(23:0) and 8 data bits indicated as Data(7:0), an Address/Data pair can exist with Address(20), Data(7) and all other address bits set to the binary pattern "001x,0011,1010,0011,0011,0001" (the x indicating the location of Address(20)). In this example it is clear that there are exactly two memory Addresses that meet the requirements of this Address/Data pair (Hexadecimal addresses 0x23A331 and 0x33A331). Because there are exactly two memory addresses that meet the requirement for this Address/Data pair, then there are also exactly 2 values of Data(7) represented in this Address/Data pair. The possibilities of the Data(7) values are "00", "01", "10", and "11". Another way of describing these values is the relationship between Address(20) and Data(7) in this pair. Those relationships are: first, Data(7)=1; second, Data(7)=NOT(Address(20)); third, Data(7)=Address(20); and fourth, Data(7)=0. As a list for clarity, the possibilities are:

Data(7)=1
Data(7)=(NOT(Address(20))
Data(7)=Address(20)
Data(7)=0

It can then be shown that for a memory device 210 with m address bits indicated as Address(m−1:0), and n data bits indicated as Data(n−1:0); every address and data bit are part of an Address/Data pair such that Data(x)=(1, NOT Address(y), Address(y), 0) for n>x≥0 and m>y≥0. Two of the four possible output functions of Data(x), (specifically Data(x)=Address(y) and Data(x)=NOT(Address(y))) are useful in constructing an exciter 200 composed of ring oscillator in accordance with the present invention and we will refer to these outputs as being a function of Address(y), Data(x)=fn(Address(y)). There are two methods that may be used to provide an Address(y)/Data(x) pair in which Data(x) is a function of Address(y): (1) investigate memory to find memory addresses where Data(x)=fn(Address(y)) or (2) write into unused memory locations to produce the appropriate output.

A state machine is provided that counts through all possible Address(y)/Data(x) pairs. In accordance with this embodiment, the address bus is divided into two domains for this state machine, Address(y) and all other address bits, which is referred to as Address(A-y) (where A represent the entire unit of the address bus). The state machine investigates the memory locations Address(A-y, y). For each set of locations specified by Address(A-y, y) there are two possible addresses, Address(A-y, 1) and Address(A-y, 0). The value of D(x) is compared at locations Address(A-y, 1) and Address(A-y, 0). If the values are equal, the Address/Data pair for that location does not provide Data(x)=fn(Address(y)) and is not useful for the ring oscillator in accordance with the present invention.

A state machine in accordance with a preferred embodiment of the present invention may be developed in the following manner. Since two of the four possible data sets are usable for a ring oscillator, a 64K-byte (512K-bit) memory has only a 1 in 65,535 possibility of not having an appropriate Address(y)/Data(x) pair for use in accordance with the present invention. If unused memory locations are available, data may be written into these addresses to create an appropriate Address/Data pair. For instance, if a memory has data written from Address 0x00000 to Address 0xEFFFF (hexadecimal values) the values from Address 0xF0000 to 0xFFFFF may be used to create Address/Data pairs. The data in an existing memory location may be used in comparison to data written into one of the unused memory locations to create a valid Address/Data pair.

The goal is to produce a list (that is, discrimination matrix) of Address/Data pairs such that there is at least one valid Address(A-y) for each Address(y)/Data(x) pair. This is not required for the present system to work, but is the optimal condition. Additionally, because the memory device performs differently when generating a logical "0" output from generating a logical "1" output, a complete set of Address/Data pairs includes one Address(A-y) that serves as a buffer function (Data(x)=Address(y)) and one Address(A-y) that serves as an inverter function (Data(x)=NOT(Address(y))).

When the memory content provides a complete set of Address/Data pairs for all possible combinations of address and data bits, a detection circuit is produced to provide the maximum authentication of the specific memory device. As an example, a memory device with 24-bit Address (16M words) and 16-bit Data would be verified by 768 authentication vectors which may also be referred to as an authentication array. For each authentication vector, the PLD 214 sets the Address(A-y) value and connects the respective Address(y) and Data(x) signals into a ring oscillator and allows the ring oscillator to operate for a predetermined time period. At the end of the time period, the resulting Value in the impedance counter 230 (the counter that clocked by the ring oscillator) is recorded. In the optimal system, each Address(y)/Data(x) pair operates twice, once with an Address(A-y) value that produces a buffer function and once with an Address(A-y) value that produces an inverter function.

When all of the Address/Data pairs have been tested in this manner, a discrimination matrix is produced that represents the characteristic impedance of the memory/PLD exciter system. The relationship of the values in this discrimination matrix serve as a "fingerprint" of the memory device 210 in relationship to the specific PLD 214. In the previous example (a 16M×16 memory), the authentication discrimination matrix requires less than 50K-bit (approximately 6.2 KB) of memory to store the authentication values without compression or normalization. This is a reasonable amount of memory resource for modern PLDs when compared to the relatively large memory device. The authentication values may be compressed by use of normalization values and global threshold tolerances.

Figure 8:
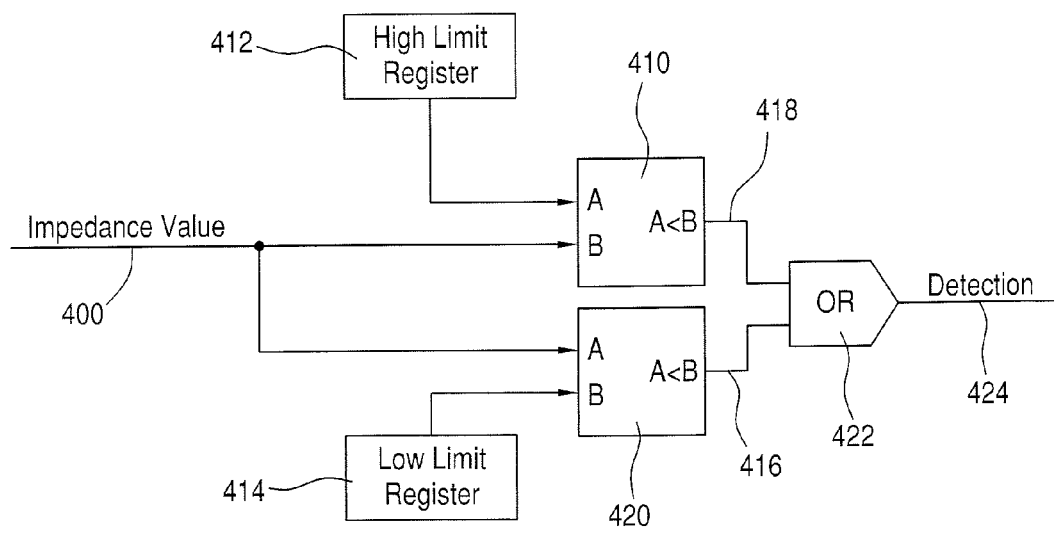
FIG. 8 is a schematic of a sensor evaluation system.

It should appreciated that in establishing the discrimination matrix, the ring oscillator based on each Address/Data pair is allowed to operate for multiple cycles so that a high threshold and low threshold is established for each pair in reference to FIG. 8 (and the accompanying explanation) of the previous application. With a range of values established, when the memory device 210 of the integrated circuit 212 is verified the process need only operate once and verify that the matrix values fall with the predetermined limits. A limit may also be set for how many values derived from the test procedure may exceed the pre-established values and by what magnitude. Alternately, a mathematical relationship may be established between the values in the array and compared to a similar mathematical evaluation of the discrimination matrix derived from test values.

The discrimination matrix (or authentication array) may be normalized or processed in other ways in order to cancel environmental effects such as operating temperature and to improve resolution of the fingerprint function.

An incomplete authentication array is also useful in determining the authenticity of the memory device 210. An authentication array composed of 255 authentication values has nearly the effectiveness of an authentication array of 256 values and is an obvious improvement over no authentication array or a small array with say 8 to 16 authentication values.

As will be described below in greater detail, the counter 230 shown in FIGS. 3 and 5, and also described in U.S. patent application Ser. No. 12/487,693, entitled "METHOD AND SYSTEM FOR DETECTION OF TAMPERING RELATED TO REVERSE ENGINEERING", filed Jun. 19, 2009, which is incorporated herein by reference, provides an accurate method of differentiating a very small difference between two groups of oscillations. The ring oscillator frequency is based on relationship between the Address/Data pairs under the control of control signal interacting with the memory device 210 of the integrated circuit 212. The oscillation is not constant and uniform like that produced by an oscillator circuit and each individual oscillation cycle may be different from the other cycles in both duty cycle and period.

As an example, a circuit may exhibit frequencies from 100.1 MHz to 100.2 MHz with an average frequency of 100.12 MHz. The average frequency of the system resonance is 100.12 MHz with a jitter of +80 KHz and −20 KHz. A change in the circuit impedance may yield a resonance with the same frequency range (100.1 MHz to 100.2 MHz) but with a different average frequency, say 101.5 MHz.

Discriminating between these two circuit responses is difficult if each oscillation cycle is measured and compared (as has been attempted in other systems). In accordance with the present system, the minute change in average frequency of each cycle is measured by adding a large number of the cycles together. This may be accomplished by counting a specific number of oscillations and determining the time required for the circuit to produce that number of oscillations (say a million counts) or it may be accomplished by setting a specific time interval and determining how many oscillations occur during that time. Either method requires a counter clocked with the impedance-based oscillation (ring oscillator) as its input frequency and another counter clocked from a reference oscillator as described in U.S. patent application Ser. No. 12/487,693, entitled "METHOD AND SYSTEM FOR DETECTION OF TAMPERING RELATED TO REVERSE ENGINEERING", filed Jun. 19, 2009, which is incorporated herein by reference.

The first measurement technique (counting the number of oscillations) may be compared to measuring extremely thin material by stacking a million sheets of the material and then measuring the entire stack height. The second measurement technique (setting a reference time and counting the oscillations during this time) is analogous to setting a height standard and stacking a quantity of the thin material up to the height standard. The average thickness is then determined by counting the number of items required to reach the height standard.

As discussed below in more detail, using the reference counter with the impedance counter allows us to accurately differentiate between oscillations that have the same range, but a slightly different average value.

As described in U.S. patent application Ser. No. 12/487,693, entitled "METHOD AND SYSTEM FOR DETECTION OF TAMPERING RELATED TO REVERSE ENGINEERING", filed Jun. 19, 2009, which is incorporated herein by reference, and briefly discussed above, the present sensor 201 includes a threshold function 231. The threshold function 231 monitors the results generated by the impedance counter 230, and includes monitoring components similar to those disclosed in the '693 application. The threshold function includes a relatively reliable and stable oscillator referred to as the reference oscillator. The reference oscillator must be relatively consistent over temperature extremes and over long periods of time. In accordance with a preferred embodiment, the reference oscillator is composed of a quartz oscillator with 100 ppm frequency accuracy, although it is contemplated other highly reliable oscillators may be used in conjunction with the present sensor without departing from the spirit of the present invention.

The output of the reference oscillator drives a binary counter referred to as the reference counter. The reference counter is used to measure a specific interval of time (or a time reference) for the purpose of monitoring count rate of the impedance counter 230, which is ultimately used to determine changes in the memory integrated circuit based upon monitored variations in the count rate generated by the exciter 200 as monitored by the impedance counter 230. When the specific interval of time has elapsed, the reference counter generates control signals for the impedance counter 230 and the impedance register. These control signals cause the following events to occur: (1) the impedance counter 230 is temporarily disabled (that is, the impedance counter 230 stops counting), (2) the data value (that is, the count value which represents the oscillation rate) in the impedance counter 230 is transferred into the impedance register via the signal bus, (3) the impedance counter 230 is cleared (zeroed) and allowed to restart its counting process. The time interval is set sufficiently long enough that changes in impedance result in a sufficient change in the count value generated by the impedance counter 230 so that changes in the count rate are detectable and significant. One millisecond is a sufficient time interval for some applications. Longer or shorter increments may be applicable in other applications.

After the impedance counter 230 data is transferred into the impedance register, the data is referred to as impedance data or impedance value. The impedance value is a function of the impedance of the circuit, both the connecting traces between the integrated circuits and the input impedance of each integrated circuit. The value is also a function of the response of the memory integrated, and that is the point for this functionality—if the memory device 212 and/or integrated circuit 210 has been stressed or replaced, the response will be different, and therefore the value will change. It is contemplated this value could also be referenced as the "response" value in this case as a combination of the PLD 214 and integrated circuit 210 impedance, and the memory device/integrated circuit response.

The symbol Z may be used to refer to the impedance value based on the mathematical symbol, Z, for impedance. The impedance value does not translate directly to a specific impedance measured in ohms, but does indicate a relative impedance value and whether a change in relative impedance has occurred. In general, the impedance value is a numeric value that, through comparison of the values generated over a period of time, is indicative of impedance changes in the external circuit based upon tampering and other events. The Z Value is transferred via signal bus into a sensor evaluation system that compares the impedance value to threshold values to determine if a significant change has occurred. When changes have occurred this is indicative of abnormal behavior and may be indicative of tampering relating to the evaluation of the electronic circuit for the purpose of reverse engineering. Details of the sensor evaluation system are discussed below in greater detail.

Figure 6:
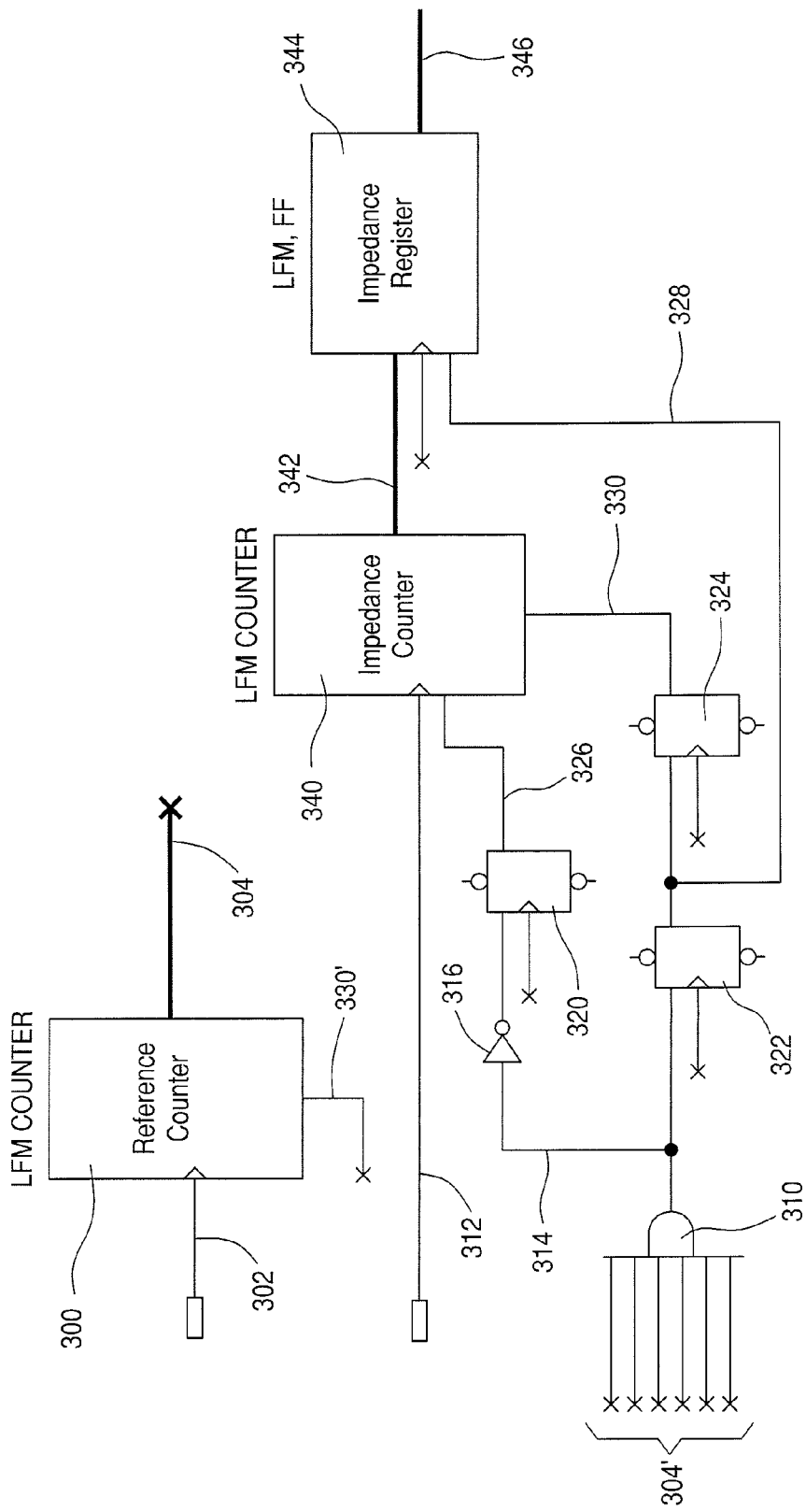
FIG. 6 is a schematic showing the reference counter and impedance counter components in detail.

FIG. 6 illustrates a preferred embodiment of the reference counter and the impedance counter components. In accordance with this implementation, the reference counter 300 receives a clock signal 302 from the reference oscillator (not shown in this figure). The output count value 304 and 304' of the reference counter 300 is an n-bit wide bus. Specific bit value 304' of the output count are connected to an AND gate 310 to indicate the desired count value (implements an interval of slightly over 1 millisecond in this example) for enablement of the impedance counter 340 and the impedance register 344 as discussed herein in greater detail. The output 314 of the AND Gate 310 is routed through inverter 316 and flipflop 320 to create the ENABLE signal 326 for the impedance counter 340. The impedance counter 340 receives the impedance frequency 312 as its clock signal. The ENABLE signal 326 enables the impedance counter 340 until the desired count value is reached. The output 314 of the AND Gate 310 is also routed through flipflop 324 to create the ENABLE signal 328 for the impedance register 344. The ENABLE signal 328 then routes through flipflop 324 to produce the CLEAR signal 330 which is connected to the CLEAR input of the Impedance Counter 340.

When the output count value 304 of the reference counter 300 is less than the desired terminal value, the impedance counter 340 is enabled by ENABLE signal 326 and the impedance register 344 is not enabled. When the output count value 304 of the reference counter 300 reaches the desired terminal count value, the AND Gate 310 outputs a logical "1" that causes (1) the impedance counter 340 to stop counting because the ENABLE signal 326 becomes a logical "0" (low) value, (2) the impedance register 344 is enabled because the Enable signal 328 becomes a logical "1" (high) value, and (3) the x-bit impedance value 346 (the output of impedance register 344) assumes the last value of the x-bit output of the impedance counter 342. One reference clock cycle later the CLEAR signal 330 and 330' becomes true causing both counters to reset so that the process starts over.

Figure 7:
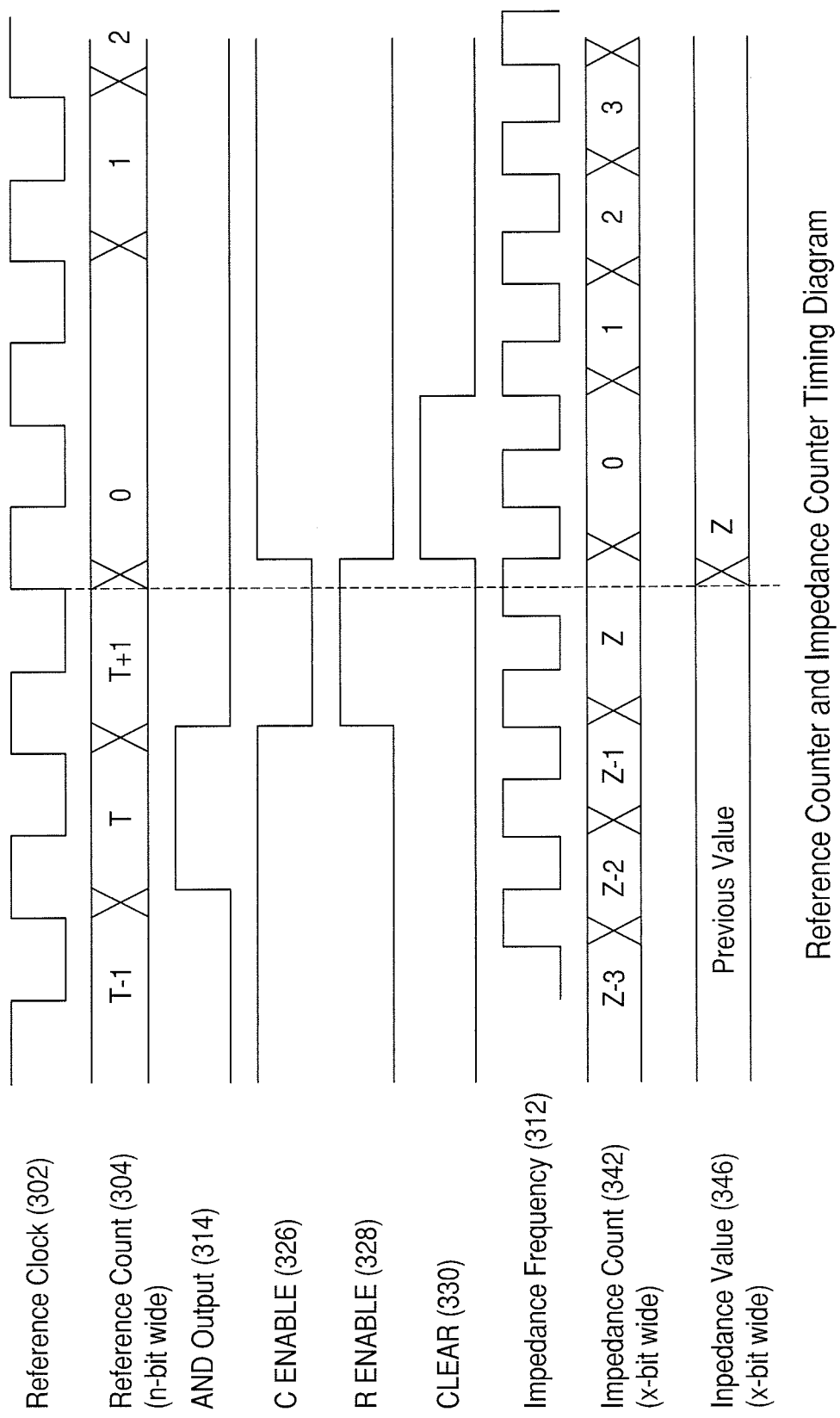
FIG. 7 is a timing diagram of the reference counter and impedance counter.

FIG. 7 shows the timing diagram of the reference counter 300 and impedance counter 340 around the terminal count time T.

The sensor evaluation system compares the impedance value or Z Value (as received from signal bus 346 in FIGS. 6 and 7) stored in the impedance register (344 in FIG. 6) to threshold values in order to determine whether the change in impedance has exceeded acceptable levels. These impedance values may be stored for later evaluation or provided to an alarm system for immediately indicating that tampering has occurred and should be addressed.

FIG. 8 shows an implementation of the sensor evaluation system. The impedance value 400 is input into first and second comparators 410, 420. The second comparator 420 compares the impedance value 400 with a threshold value stored in the low limit register 414. When the impedance value is below the low limit threshold value, the A<B output 416 of the second comparator 420 indicates that a change in impedance has been detected. Similarly, the impedance value 400 is compared to a high limit threshold value stored in high limit register 412. When the impedance value 400 is greater than the High Limit threshold value, the A<B output 418 of the first comparator 410 indicates that a change in impedance has been detected. In this implementation, the outputs 416, 418 of the first and second comparators 410, 420 are logically combined (logical OR) so that the resulting detection signal 424 indicates any impedance value outside the acceptable limits.

The threshold values that determine the acceptable impedance limits may be determined ahead of time and stored in the respective register or these values may be determined dynamically. In the case of dynamic determination of the threshold limits, the sensor is allowed to operate for some period of time. The highest impedance value recorded during this test time is stored into a register as is the lowest recorded impedance value. An adjustment value is applied to each of the stored values and the adjusted value is transferred into the respective limit registers.

Figure 9:
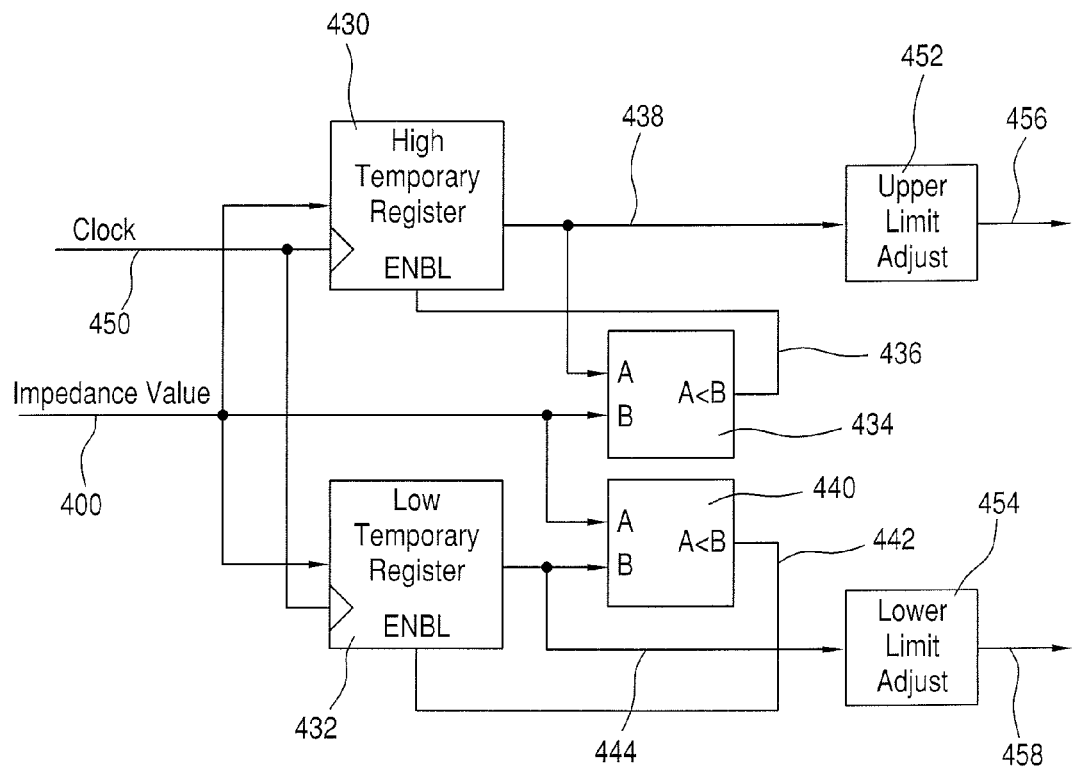
FIG. 9 illustrates a system for the determining threshold limits dynamically.

FIG. 9 illustrates a system for the determining threshold limits dynamically. When this system begins operation, the high temporary register 430 (an x-bit wide binary register) is cleared by insertion of all zeros and the low temporary register 432 (an x-bit wide binary register) is set to all ones. The first comparator 434 compares the x-bit impedance value 400 to the x-bit value 438 stored in the high temporary register 430. When the impedance value 400 is greater than the stored x-bit value 438, the high temporary register 430 is enabled by the A<B output 436 of the first comparator 434 and the impedance value data is clocked into the high temporary register 430 on the next rising edge of the clock signal 450. Because any impedance value will be greater than zero (that the high temporary register 430 has been cleared to), the high temporary register 430 will receive the first impedance value 400 at the start of the process.

Similarly, the second comparator 440 compares the x-bit impedance value 400 to the x-bit value 444 stored in the low temporary register 432. When the impedance value 400 is less than the stored x-bit value 444, the low temporary register 432 is enabled by the A<B output 442 of the second comparator 440 and the impedance value data is clocked into the low temporary register 432 on the next rising edge of the clock signal 450. Because any impedance value 400 will be less than the "all ones" value that the low temporary register 432 has been set to, the low temporary register 432 will receive the first impedance value at the start of the process.

The upper limit adjust 452 adds an appropriate buffer value to the x-bit value 438 stored in the high temporary register 430 to produce the high limit value 456 which is output to be stored in a high limit register 412 as shown in FIG. 8. Similarly, the low limit adjust 454 subtracts an appropriate value from the x-bit value 444 stored in low temporary register 432 to produce the low limit value 458 to be stored in a low limit register 414 as illustrated in FIG. 8. The adjustment of the limit values provides some tolerance to the values that have been observed. The magnitude of the adjustment value may be pre-determined or may be derived as a function of the difference between the high and low temporary values, the magnitude of temporary values, or some combination of methods. Many functions for producing the adjustment value may be employed without violating the spirit of this patent.

After the threshold determination process has operated for an appropriate length of time, the high limit value 456 and the low limit value 458 are loaded into high limit register 412 and low limit register 414 as shown in FIG. 8. This application anticipates the use of multiple limit registers to indicate different levels of impedance change that would require different levels of response.

Figure 10:
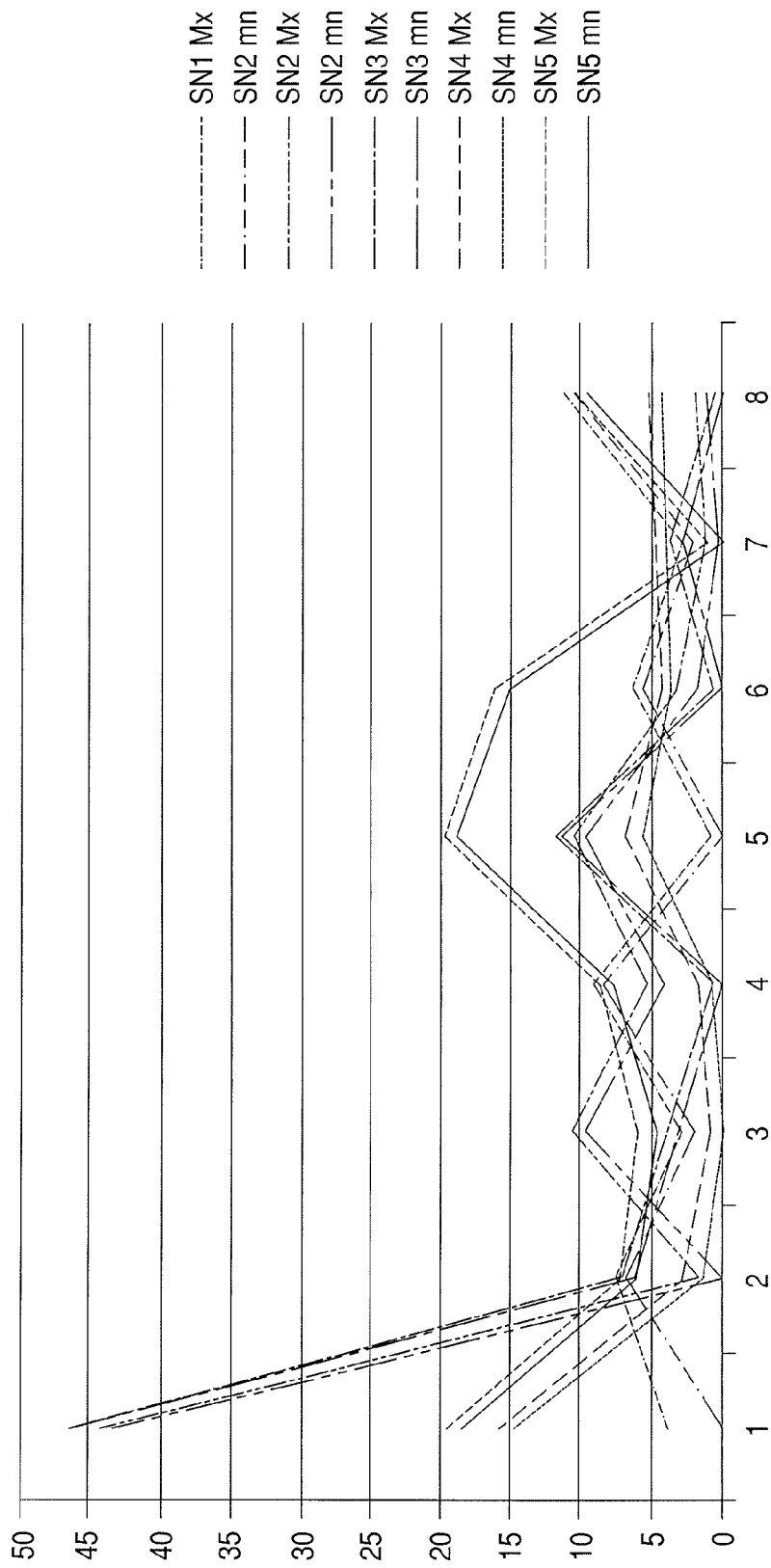
FIG. 10 is a comparison of 5 (five) devices that are supposedly completely identical in accordance with the principles of the present invention.

Referring to FIG. 10, profiles obtained via application of the principles of the present invention for 5 devices are disclosed. These devices are supposedly completely identical. However, and as FIG. 10 demonstrates, each device has a unique profile which may be employed in the identification thereof.

Because the present sensor is sensitive to temperature changes, it is contemplated the present system may employ a mechanism for monitoring the external and internal temperature of the integrated circuit. With monitoring of the external and internal temperature of the integrated circuit, the present system may employ an algorithm that balances out the effects of temperature changes upon the present system and ultimately upon the integrated circuit so as to ensure accurate monitoring.

In accordance with a preferred embodiment, this is achieved by comparing the frequency of the two ring oscillators that each includes a different number of logic elements. The difference in the number of logic elements causes the two ring oscillators to have different temperature coefficients. If the frequency of one ring oscillator is subtracted from the frequency of the other, a temperature dependent function is derived. Alternatively, an analog or digital temperature sensor may be monitored for temperature values.

The use of multiple ring oscillators in accordance with a preferred embodiment of the present invention, also allows for independent monitoring of both the integrated circuit temperature and the voltage passing therethrough. By using this technology, the present system may be employed to monitor a wide variety of integrated circuit characteristics that ultimately may be used for improving the security thereof, for example, in determining when components of the integrated circuit or the apparatus of which it forms a part have been changed.

While the preferred embodiments have been shown and described, it will be understood that there is no intent to limit the invention by such disclosure, but rather, is intended to cover all modifications and alternate constructions falling within the spirit and scope of the invention.

The invention claimed is:

1. A system employing physical unclonable functions of an integrated circuit for detecting integrated circuits and protecting products and technology from integrated circuits which have been subject to tampering, stressing and replacement, comprising:
the sensor detecting a characteristic impedance generated as a result of controlled access to a memory device of the integrated circuit, the characteristic impedance applied in creation of a discrimination matrix of values based on electrical interface signals for the integrated circuit;
the sensor includes a ring oscillator and associated monitoring components, the ring oscillator is composed of the memory device of the integrated circuit and a sensory circuitry, wherein changes in a frequency generated by the ring oscillator is indicative of changes in circuitry;
wherein the memory device is the delay function and the data values are equal to the address values and the frequency of the ring oscillator is a direct function of Address/Data pairs of the memory device of the integrated circuit and Address bits of the memory device are held constant and frequency of oscillation resulting from the ring oscillator is a function of the propagation delay and impedance of the Address bits and Data bits accessed under control of a control function.

2. The system according to claim 1, wherein the ring oscillator includes a logical inverter function and a delay function.

3. The system according to claim 2, wherein data values of the memory device are the inverse of the address values of the memory device, and the memory device is the inverter function.

4. The system according to claim 1, wherein the memory device is the delay function and the data values are equal to the address values.

5. A system employing physical unclonable functions of an integrated circuit for detecting integrated circuits and protecting products and technology from integrated circuits which have been subject to tampering, stressing and replacement, comprising:
a sensor detecting a characteristic impedance generated as a result of controlled access to a memory device of the integrated circuit, the characteristic impedance applied in creation of a discrimination matrix of values based on electrical interface signals for the integrated circuit;
the sensor includes a ring oscillator and associated monitoring components, the ring oscillator is composed of the memory device of the integrated circuit and a sensory circuitry, wherein changes in a frequency generated by the ring oscillator is indicative of changes in circuitry;
wherein the frequency of the ring oscillator is a direct function of Address/Data pairs of the memory device of the integrated circuit and the discrimination matrix is developed identifying individual Address/Data pairs for consideration in distinguishing and identifying the integrated circuit.

6. The system according to claim 5, further including a state machine that counts through all possible Address/Data pairs.

7. The system according to claim 5, wherein the discrimination matrix represents the characteristic impedance of the ring oscillator based upon different Address/Data pairs.

8. The system according to claim 5, wherein the sensory circuitry is implemented in a PLD.

9. The system according to claim 5, wherein the sensory circuitry is implemented in a ASIC.

10. The system according to claim 5, wherein the sensory circuitry is implemented in a processor.

11. A system for authenticating integrated circuits and protecting products and technology from integrated circuits which have been subject to tampering, stressing and replacement, comprising:
a sensor detecting time delays in retrieval of data bits based upon address bits as a result of controlled access to a memory device of the integrated circuit, the time delays applied in creation of a discrimination matrix of values based on electrical interface signals for the integrated circuit;
the sensor includes the memory device of the integrated circuit in communication with a sensory circuitry, wherein changes in time delays are indicative of changes in circuitry;
wherein the time delays are a direct function of Address/Data pairs of the memory device of the integrated circuit and the discrimination matrix is developed identifying individual Address/Data pairs for consideration in distinguishing and identifying the integrated circuit.

12. The system according to claim 11, wherein data values of the memory device are the inverse of the address values of the memory device, and the memory device is the inverter function.

13. The system according to claim 11, further including a state machine that counts through all possible Address/Data pairs.

14. The system according to claim 11, wherein the sensory circuitry is implemented in a PLD.

15. The system according to claim 11, wherein the sensory circuitry is implemented in a ASIC.

16. The system according to claim 11, wherein the sensory circuitry is implemented in a processor.

* * * * *